(12) United States Patent
Liu et al.

(10) Patent No.: US 11,287,253 B2
(45) Date of Patent: Mar. 29, 2022

(54) DEVICE AND METHOD APPLICABLE FOR MEASURING ULTRATHIN THICKNESS OF FILM ON SUBSTRATE

(71) Applicant: INDUSTRIAL TECHNOLOGY RESEARCH INSTITUTE, Hsinchu (TW)

(72) Inventors: Chun-Ting Liu, Taichung (TW); Han-Yu Chang, Kaohsiung (TW); Bo-Ching He, Hsinchu (TW); Guo-Dung Chen, New Taipei (TW); Wen-Li Wu, Hsinchu (TW); Wei-En Fu, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 110 days.

(21) Appl. No.: 16/730,236

(22) Filed: Dec. 30, 2019

(65) Prior Publication Data
US 2021/0199428 A1 Jul. 1, 2021

(51) Int. Cl.
*G01B 15/02* (2006.01)
*G01N 23/223* (2006.01)
*G01N 23/2252* (2018.01)

(52) U.S. Cl.
CPC .......... *G01B 15/02* (2013.01); *G01N 23/223* (2013.01); *G01B 2210/56* (2013.01);
(Continued)

(58) Field of Classification Search
CPC .. G01B 15/02; G01B 2210/56; G01N 23/223; G01N 23/2252; G01N 2223/076;
(Continued)

(56) References Cited

U.S. PATENT DOCUMENTS

| | | |
|---|---|---|
| 5,778,039 A | 7/1998 | Hossain et al. |
| 6,263,042 B1 | 7/2001 | den Hartog et al. |
| 2007/0100580 A1 | 5/2007 | Marcus |

FOREIGN PATENT DOCUMENTS

| | | |
|---|---|---|
| TW | 201245659 A1 | 11/2012 |
| TW | 201530091 A | 8/2015 |

OTHER PUBLICATIONS

De Bokx et al., "Grazing-emission X-ray fluorescence spectrometry; principles and applications", Spectrochimica Acta Part B, vol. 52, No. 7, 1997, pp. 829-840.
(Continued)

*Primary Examiner* — Mark R Gaworecki
(74) *Attorney, Agent, or Firm* — Birch, Stewart, Kolasch & Birch, LLP

(57) ABSTRACT

The present disclosure relates to a device and a method for measuring a thickness of an ultrathin film on a solid substrate. The thickness of the target ultrathin film is measured from the intensity of the fluorescence converted by the substrate and leaking and tunneling through the target ultrathin film at low detection angle. The fluorescence generated from the substrate has sufficient and stable high intensity, and therefore can provide fluorescence signal strong enough to make the measurement performed rapidly and precisely. The detection angle is small, and therefore the noise ratio is low, and efficiency of thickness measurement according to the method disclosed herein is high. The thickness measurement method can be applied into In-line product measurement without using standard sample, and therefore the thickness of the product can be measured rapidly and efficiently.

20 Claims, 8 Drawing Sheets

(52) U.S. Cl.
CPC ... *G01N 23/2252* (2013.01); *G01N 2223/076* (2013.01); *G01N 2223/079* (2013.01); *G01N 2223/61* (2013.01); *G01N 2223/6116* (2013.01)

(58) Field of Classification Search
CPC ......... G01N 2223/079; G01N 2223/61; G01N 2223/6116
See application file for complete search history.

(56) References Cited

OTHER PUBLICATIONS

Extended European Search Report for European Application No. 20171530.7, dated Nov. 10, 2020.
Spolnik et al., "Grazing-exit electron probe X-ray microanalysis of ultra-thin films and single particles with high-angle resolution", Analytica Chimica Acta, vol. 455, No. 2, Mar. 2002, pp. 245-252.
Tsuji et al., "New experimental equipment for grazing-exit electron-probe microanalysis", Review of Scientific Instruments, vol. 72, No. 10. Oct. 2001, pp. 3933-3936.
Tsuji, "Grazing-exit electron probe X-ray microanalysis (GE-EPMA): Fundamental and applications", Spectrochimica Acta Part B, vol. 60, No. 11, Nov. 2005, pp. 1381-1391.
De Bokx et al., "Laboratory grazing-emission x-ray fluorescence spectrometer", Rev. Sci. Instrum., vol. 66, No. 1, Jan. 1995, pp. 15-19 (6 pages).
Iida et al., "Grazing Incidence X-Ray Fluorescence Analysis", Nuclear Instruments and Methods in Physics Research, A246, 1986, pp. 736-738 (3 pages).
Lekner, John, "Theory of Reflection of Electromagnetic and Particle Waves", Developments in electromagnetic theory and applications, Springer-Science+Business Media, B.V., 1987, 7 pages.
Parratt, L.G., "Surface Studies of Solids by Total Reflection of X-Rays", Physical Review, vol. 95, No. 2, Jul. 15, 1954, pp. 359-369 (11 pages).
Taiwanese Office Action and Search Report for Taiwanese Application No. 109108564, dated Aug. 4, 2021.

DEVICE AND METHOD APPLICABLE FOR MEASURING ULTRATHIN THICKNESS OF FILM ON SUBSTRATE

TECHNICAL FIELD

The application relates generally to a device and a method applicable for measuring a thickness of an ultrathin film on a substrate.

BACKGROUND

The semiconductor integrated circuit (IC) industry has experienced rapid growth. Technological advances in IC materials and design have produced generations of ICs. Each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, these advances have increased the complexity of processing and manufacturing ICs. Since feature sizes continue to decrease, fabrication and measurement processes continue to become more difficult to perform.

In the past, common methods for detecting film thickness are X-ray reflectivity (XRR) and X-ray fluorescence (XRF) [1], but the measurement of ultra-thin film encountered some challenges. The XRR technique has the disadvantage of high noise ratio resulted from the high detecting angle required for measuring the thickness of the thin film thinner than about 1 nm. The XRF technique has the disadvantage of long measurement time due to the minuscular sample volume, hence, weak fluorescence signals for films thinner than about 1 nm. In addition, standard samples of known thickness need to be prepared, measured and then to establish calibration curves for the XRF measurement for thin film thickness.

Therefore, a novel measurement technique satisfying requirements of both high efficiency and non-destructive is needed.

REFERENCES

Reference [1]: "*Grazing incidence X-ray fluorescence analysis*" A. Iida K. Sakurai A. Yoshinaga Y. Gohshi, Nucl. Instrum. Methods Phys. Res. A., 246, 736(1986).
Reference [2]: ISBN 90-247-3418-5, "*Theory of Reflection*", John Lekner, (1987).
Reference [3]: "*Surface Studies of Solids by Total Reflection of X-Rays*", L. G. Parratt, Phys. Rev. 95, 359 (1954).
Reference [4]: The U.S. Pat. No. 6,263,042, entitled as "Apparatus for X-ray analysis in grazing exit conditions", relates to technique of grazing exit X-ray fluorescence (GEXRF).

SUMMARY

According to one embodiment of this disclosure, what is provided is a device for measuring the thickness of an ultrathin film, the target of the device and the measurement method discussed herein, on a solid substrate. The device comprises a radiation source and a fluorescence X-ray detector. The radiation source is configured to project an excitation radiation toward the upper surface of the target ultrathin film with an incident angle θ1 with respect to the upper film surface, wherein the value of θ1 can be near 90°, i.e. near a normal incident direction. The fluorescence X-ray detector is configured to measure a fluorescence X-ray converted from the excitation radiation by the substrate with a grazing detection angle θ2 with respect to the target ultrathin film surface, over a preset grazing angular range. A wavelength or an energy dispersive detector is an essential part of this invention; it will enable the selection of a suitable the characteristic fluorescence X-ray from the substrate layers as the probe of the film thickness. In general, fluorescence with long wavelength is preferred over those with short wavelength.

According to another embodiment of this disclosure, what is provided is a method for measuring a thickness of an ultrathin film over a substrate, comprising: projecting a excitation radiation toward an upper surface of the target ultrathin film with an incident angle θ1 with respect to the upper surface of the target ultrathin film, wherein preferred range of θ1 is over 45° to 90°; and detecting a fluorescence X-ray converted from the excitation radiation by the substrate with a grazing detection angle θ2 defined with respect to the upper surface of the target ultrathin film, wherein the preferred angular range is 2°≥θ2≥0°.

The above and other aspects of this disclosure will become better understood with regard to the following detailed description of the preferred but non-limiting embodiments. The following description is made with reference to the accompanying drawings.

Figure 1:
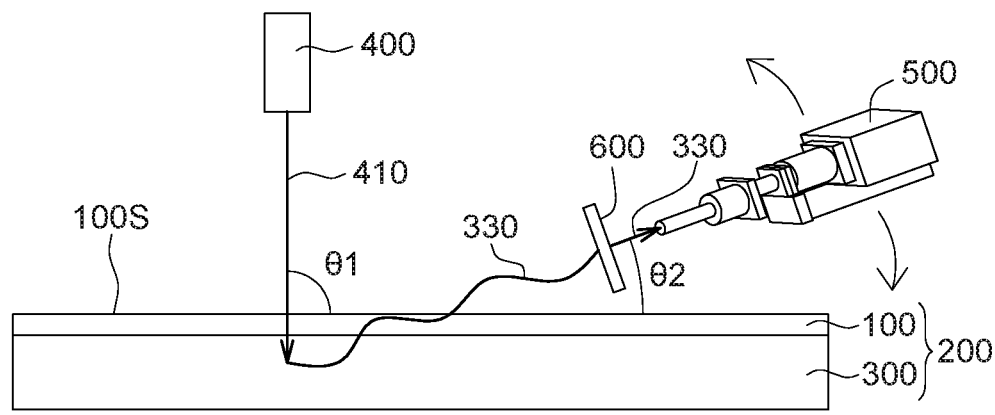
FIG. 1 shows a device for measuring a thickness of an ultrathin film on a substrate according to one embodiment.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Figure 2A:
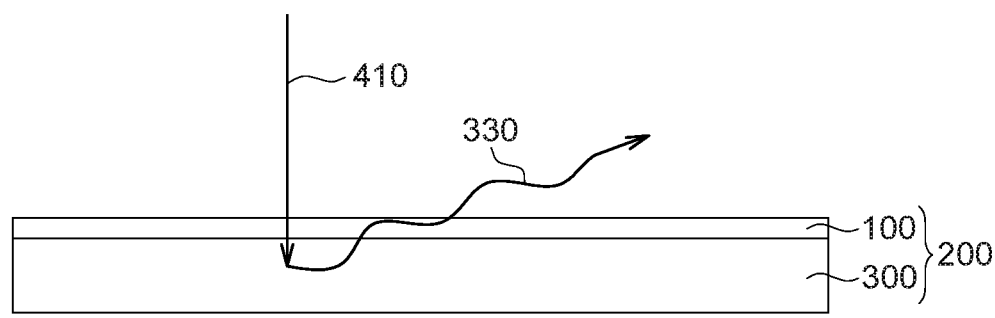
FIG. 2A shows a method for measuring a thickness of an ultrathin film on a substrate according to one embodiment.
Figure 2B:
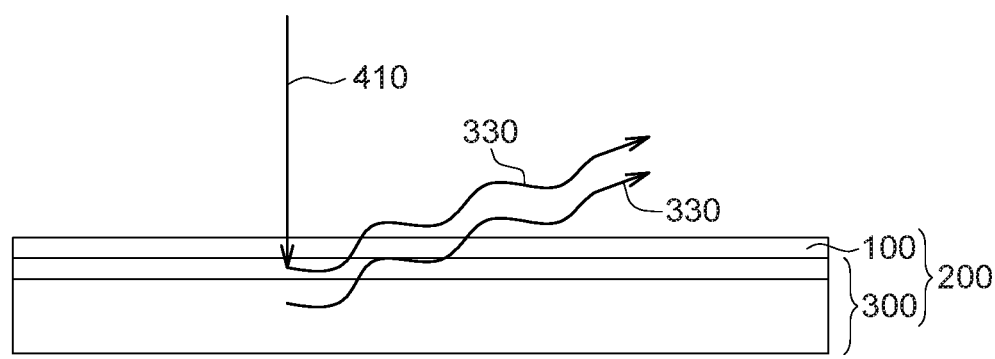
FIG. 2B shows a method for measuring a thickness of an ultrathin film on a two-layer substrate according to one embodiment.

FIG. 1 is referred, showing a device for measuring the thickness of a target ultrathin film 100, the target of the device and the measurement method discussed herein, on a substrate 300. A test sample 200 comprises the target ultrathin film 100 and the substrate 300. The method disclosed herein is a substrate assisted X-ray leakage method for ultrathin film thickness measurement (SAXRL). The thickness of the target ultrathin film 100 is measured from the intensities of the fluorescence X-ray 330 (i.e. the fluorescence X-ray intensities) converted by the substrate 300 and leaking or tunneling through the target ultrathin film 100 at various detection angle, such as a grazing detection angle θ2. The fluorescence X-ray 330 generated from the substrate 300 has sufficient and stable high intensity due to an ample substrate thickness about a millimeter instead of a few nanometers for the target thin film, therefore, can provide fluorescence signal strong enough to make the measurement performed rapidly and precisely. The method and the device disclosed herein can be used to measuring the thickness of a few nanometers (nm) or less of the target ultrathin film 100. The thickness of the target ultrathin film 100 which can be measured by the method and the device disclosed herein can be 0.2 nm to 2 nm. The target ultrathin film 100 having the thickness to be measured by the method and the device disclosed herein has X-ray scattering length density (SLD) preferably higher than the X-ray scattering length density of the substrate 300 under the target ultrathin film 100. The abovementioned substrate 300 can comprise a single material layer including a silicon wafer, a GaAs wafer, a InP wafer and/or other commonly encountered substrates, and the target ultrathin film 100 comprise a single material layer, as shown in FIG. 2A. Otherwise, the abovementioned substrate 300 can comprise multiple layers of different materials, and the target ultrathin film 100 can comprise a single material layer, as shown in FIG. 2B. Alternatively, the target ultrathin film 100 can comprise multiple layers of different materials. The abovementioned fluorescence X-ray 330 includes those from one or more layers comprising the substrate 300, or from one or more elements comprising the substrate 300. The target ultrathin film 100 and the substrate 300 may comprise semiconductor materials, but are not limited thereto.

The device comprises a radiation source 400 and a fluorescence X-ray detector 500.

The radiation source 400 is configured to project an excitation radiation 410 toward the upper surface 100S of the target ultrathin film 100 with an incident angle θ1 with respect to the upper surface 100S of the target ultrathin film 100, to generate fluorescence X-ray 330 from the substrate 300. The preferred range of θ1 is over 45° to 90°. The value of θ1 can be near 90°, i.e. near a normal incident direction. The excitation radiation 410 comprises an X-ray beam or an electron beam with their energy sufficiently high to excite desirable fluorescence X-ray 330 from one or more preselected substrate layers of the substrate 300.

The fluorescence X-ray detector 500 is configured to measure a fluorescence X-ray 330 converted from the excitation radiation 410 by the substrate 300 with a grazing detection angle θ2 with respect to the upper surface 100S, over a preset grazing angular range. The fluorescence X-ray detector 500 is configured to receive the fluorescence X-ray 330 leaked through the target ultrathin film 100 over a range of the grazing detection angle θ2. The fluorescence X-ray detector 500 is capable of scanning through a preset angular range with an angular step of one hundredth or less of the angular range of θ2. A preferred θ2 angular range is between 0° and 2°, or beyond. The range of the grazing detection angle θ2 is chosen to be less than or comparable to the critical angle [2] of substrate/thin film pairs commonly encountered in IC applications. The critical angle of an interface is dictated by the scattering length density of the materials across the interface as well as the wavelength of the substrate fluorescence X-ray. At θ2 less than the substrate/thin film critical angle the fluorescence X-ray originated from the substrate can leak through the thin film of a few nanometers thick or less; whereas as θ2 becomes greater than the substrate/thin film critical angle a majority of the fluorescence X-ray will leak through the thin film regardless of the film thickness, hence, renders a drop in its sensitivity of measuring film thickness. The abovementioned fluorescence X-ray detector 500 is capable of collecting fluorescence X-ray 330 over a range of energies or wavelengths simultaneously and quantifying the intensity distribution of the observed fluorescence X-ray 330 over the energy or wavelength window of interests. The fluorescence X-ray detector 500 is capable of discerning energies and/or wavelengths of the fluorescence X-ray observed, thereby, to collect the intensities of all selected fluorescence energies or wavelengths concurrently. The fluorescence X-ray intensities (i.e. the intensities of the fluorescence X-ray 330) are detected with a plurality of the grazing detection angles θ2. The fluorescence X-ray detector 500 is capable of measuring a distribution of the fluorescence X-ray intensities (or the intensity distribution) as a function of the fluorescence wavelength or energy; thereby to selectively/concurrently measure the intensity (or the fluorescence X-ray intensities) originated from certain layers (e.g. one or more layers) and/or certain elements (e.g. one or more elements) comprising the substrate 300, or from certain elements of a compound substrate such as InP, GaAs and/or others.

The device further comprises a collimator 600 to define the angular resolution, δθ2, of the measured fluorescence X-ray 330 leaked through the target ultrathin film 100. The collimator 600 is configured to enable a detection angular window or opening, δθ2, at least a tenth of total angular range of θ2 or less. The collimator 600 is configured to be located between the test sample 200 and the fluorescence X-ray detector 500. The collimator 600 is configured to control the detection of the fluorescence X-ray 330 with an angular window of δθ2 at any given grazing detection angle θ2. The collimator 600 can be installed in front of the fluorescence X-ray detector 500. Both the collimator 600 and the fluorescence X-ray detector 500 can be moved in unity over a present angular range of θ2 with an angular step size less than δθ2 defined by the collimator 600. The collimator 600 may comprise a 1D collimator or a 2D collimator, which has pin holes and silts respectively.

The thickness of the target ultrathin film 100 is calculated based on an angular dependence of measured fluorescence X-ray intensities of the fluorescence X-ray 330, after the said intensity being normalized with the fluorescence intensity measured in the absence of the target ultrathin film 100 at the abovementioned θ2. The well-established algorithm by Parratt [3] will be used to deduce film thickness from the angular dependence of the measured fluorescence intensity. Using Parratt algorithm the viable range of the thickness of the thin film can be pre-determined so as to be set as the boundary of the thickness for SAXRL measurements for any given substrate-thin film pairs of known composition and density. The simulation data of the grazing detection angles θ2 from 0 degree to the ending point can be used, wherein the intensity of the fluorescence X-ray 330 corresponding to the ending point and having the maximum value is normalized as the value of 1. The simulation data is calculated to obtain an optimal observation angle at which the intensities of the fluorescence X-ray 330 for the target ultrathin film 100 of different thickness have the maximum difference therebetween. The thickness of the target ultrathin film 100 to be really measured can be deduced by fitting the real measured data at the observation angles (grazing detection angles θ2) via the recursive Parratt algorithm. Alternatively, the thickness of the target ultrathin film 100 after being measured can be obtained by finding out the one curve of the simulation data which is the most close to and has the least square error relative to the curve of the simulation. The thickness measurement method according to the present disclosure can be applied into in-line product measurement without using standard samples, and therefore the thickness of the product can be measured rapidly and efficiently.

Figure 3:
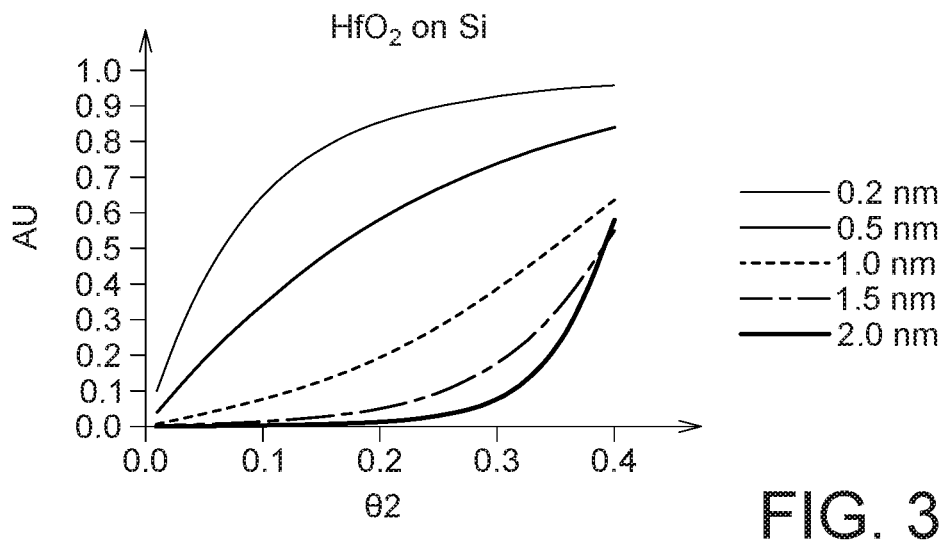
FIG. 3 shows the simulation curves, of the target ultrathin film consisting of $HfO_2$ having the thickness of 0.2 nm, 0.5 nm, 1.0 nm, 1.5 nm, and 2.0 nm respectively on the substrate consisting of Si, of the normalized intensity of the fluorescence versus the detection angles θ2.

The simulation data comprises a simulation curve obtained using the Parratt algorithm. FIG. 3 shows the simulation curves, of the target ultrathin film 100 consisting of $HfO_2$ having the thickness of 0.2 nm, 0.5 nm, 1.0 nm, 1.5 nm, and 2.0 nm respectively on the substrate 300 consisting of Si, of the normalized intensity (i.e. the maximum intensity as 1) of the fluorescence X-ray 330 versus the detection angles θ2. A respectful sensitivity of discerning film thickness between 0.2 nm to 2 nm is demonstrated.

Figure 4:
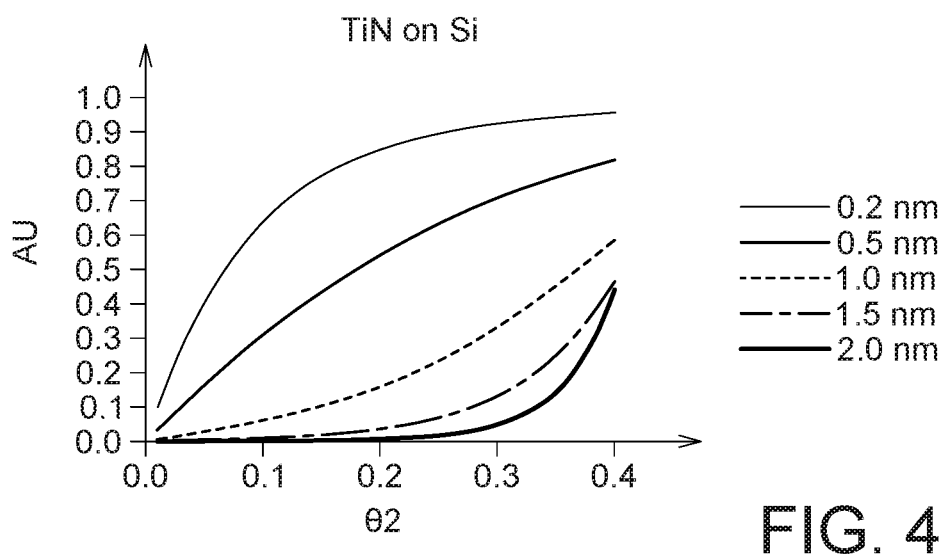
FIG. 4 shows the simulation curves, of the target ultrathin film consisting of TiN having the thickness of 0.2 nm, 0.5 nm, 1.0 nm, 1.5 nm, and 2.0 nm respectively on the substrate consisting of Si, of the normalized intensity of the fluorescence versus the detection angles θ2.

FIG. 4 shows the simulation curves, of the target ultrathin film 100 consisting of TiN having the thickness of 0.2 nm, 0.5 nm, 1.0 nm, 1.5 nm, and 2.0 nm respectively on the substrate 300 consisting of Si, of the normalized intensity of the fluorescence X-ray 330 versus the detection angles θ2. A respectful sensitivity of discerning film thickness between 0.2 nm to 2 nm is demonstrated.

Figure 5:
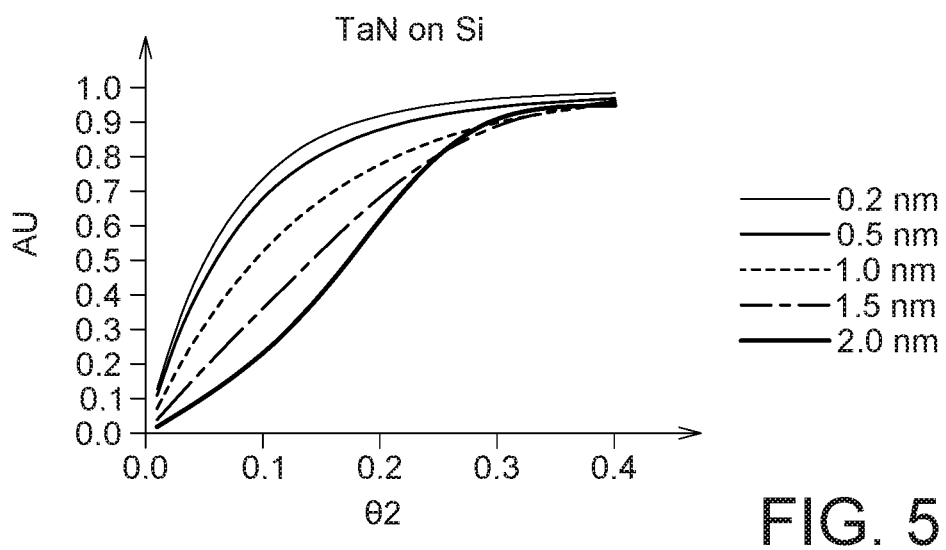
FIG. 5 shows the simulation curves, of the target ultrathin film consisting of TaN having the thickness of 0.2 nm, 0.5 nm, 1.0 nm, 1.5 nm, and 2.0 nm respectively on the substrate consisting of Si, of the normalized intensity of the fluorescence versus the detection angles θ2.

FIG. 5 shows the simulation curves, of the target ultrathin film 100 consisting of TaN having the thickness of 0.2 nm, 0.5 nm, 1.0 nm, 1.5 nm, and 2.0 nm respectively on the substrate 300 consisting of Si, of the normalized intensity of the fluorescence X-ray 330 versus the detection angles θ2. As illustrated by FIGS. 3-5 there exists a noticeable difference in the SAXRL sensitivity among $HfO_2$, TiN and TaN films while the probe is Silicon K-line. This difference can be explained by the quantity $(SLD_{film}-SLD_{substrate})^{0.5}$ [2] which is proportional to the critical angle of the film/substrate interface. Based on the data given in Table 1 the SLD of TiN and $HfO_2$ at the Silicon K-line energy is significantly greater than that of TaN; all three compounds have their SLD higher than that of Silicon. The small SLD of TaN dictates a small critical angle at the TaN/Si interface, hence, a small viable θ2 range for SAXRL. Table 1 further indicates that the SLD of TaN increases significantly as the probe is the fluorescence X-rays from either InP or GaAs. The cases of TaN on InP will be provided on FIG. 16 and FIG. 17 to highlight the impact of the probe wavelength on the sensitivity of SAXRL.

It is observed that as the thickness of the target ultrathin film 100 increases, the intensity of the fluorescence X-ray 330 originated from the substrate 300 and leaked through the target ultrathin film decreases, and vice versa. The ending angle of the simulation curve is selected as the detection angle θ2 at which the normalized intensity of the leaked fluorescence 300 has the maximum value (i.e. about 1). The ending angle depends on the thickness and material of the target ultrathin film 100 to be measured, and the material of the substrate 300.

The thickness of the target ultrathin film 100 of the test sample 200 can be calculated by fitting the experimental curve using the recursive Parratt algorithm without relying on reference samples with known thickness.

Figure 6:
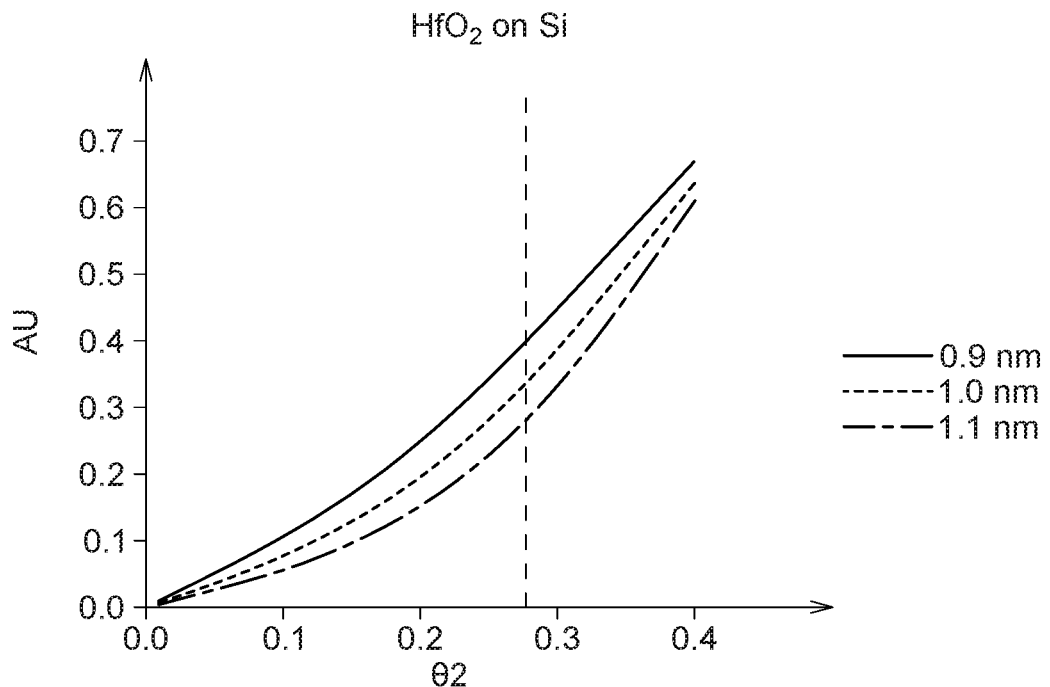
FIG. 6 shows the simulation curves, of the target ultrathin film consisting of $HfO_2$ having the thickness of 0.9 nm, 1.0 nm, 1.1 nm on the substrate consisting of Si, of the normalized intensity of the fluorescence versus the detection angles θ2.

FIG. 6 shows the simulation curves, of the target ultrathin film 100 consisting of $HfO_2$ having the thickness of 0.9 nm, 1.0 nm, 1.1 nm on the substrate 300 consisting of Si, of the normalized intensity of the fluorescence X-ray 330 versus the detection angles θ2. For the target ultrathin films 100 consisting of $HfO_2$ having the thicknesses of 0.9 nm and 1.0 nm, a difference of merely 0.1 nm in the film thickness, an optimal observation angle of 0.277 degrees provides a good sensitivity of 6.22% in terms of the difference in the observed fluorescence intensity. For $HfO_2$ films with their thicknesses of 1.0 nm and 1.1 nm, the sensitivity is also 5.44%.

Figure 7:
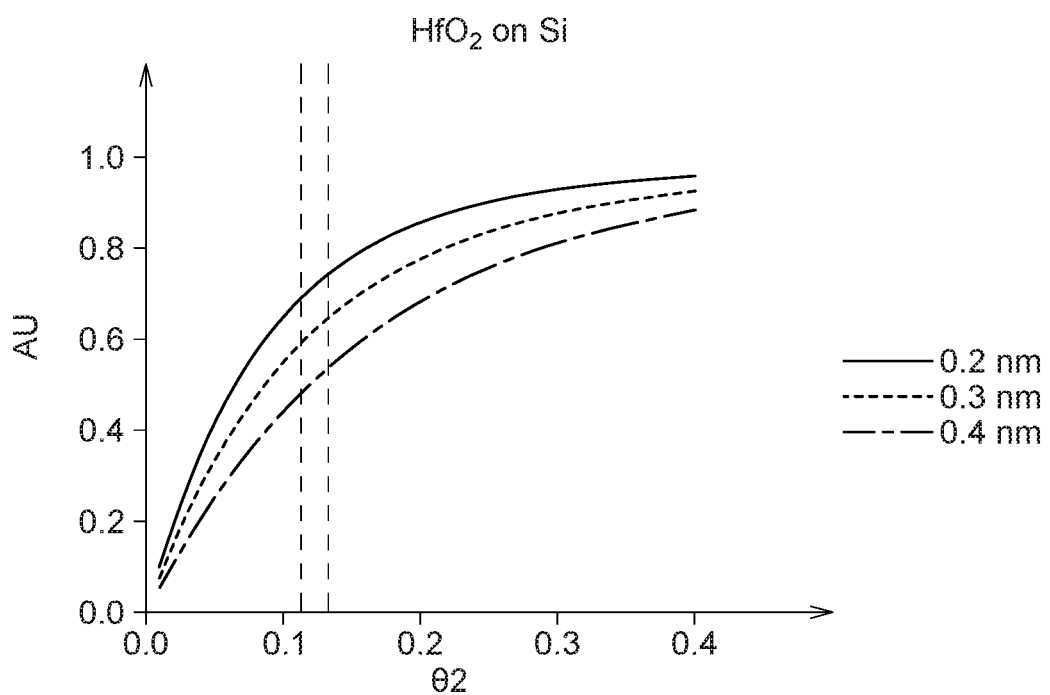
FIG. 7 shows the simulation curves, of the target ultrathin film consisting of $HfO_2$ having the thickness of 0.2 nm, 0.3 nm, 0.4 nm on the substrate consisting of Si, of the normalized intensity of the fluorescence to the detection angles θ2.

FIG. 7 shows the simulation curves, of the target ultrathin film 100 consisting of HfO$_2$ having the thickness of 0.2 nm, 0.3 nm, 0.4 nm on the substrate 300 consisting of Si, of the normalized intensity of the fluorescence X-ray 330 versus the detection angles θ2. For the target ultrathin films 100 consisting of HfO$_2$ having the thicknesses of 0.2 nm and 0.3 nm, a difference of merely 0.1 nm in the film thickness, the observation angle of 0.113 degrees provides a good sensitivity of 10.0% in terms of the difference in the leaked fluorescence intensity. For HfO$_2$ films with their thicknesses of 0.3 nm and 0.4 nm, the observation angle of 1.33 degrees provides a good sensitivity of 10.87%.

Figure 8:
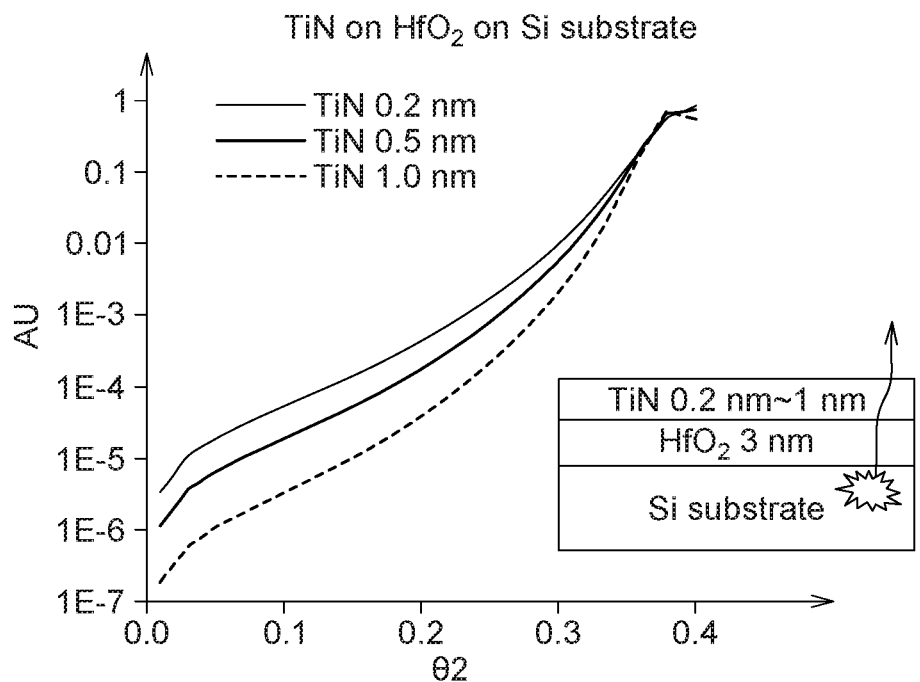
FIG. 8 shows the simulation curves, for the TiN film having the thickness of 0.2 nm, 0.5 nm, 1.0 nm on a $HfO_2$/Silicon substrate, of the normalized intensity of the Silicon K-line fluorescence versus the detection angles θ2.

FIG. 8 shows the simulation curves, for the TiN film on a HfO$_2$/Silicon substrate with the film thickness of 0.2 nm, 0.5 nm, 1.0 nm, of the normalized intensity of the Silicon K-line fluorescence X-ray 330 versus the to the detection angles θ2. The HfO$_2$ layer between the top film TiN and Silicon substrate has a thickness of 3 nm.

Figure 9:
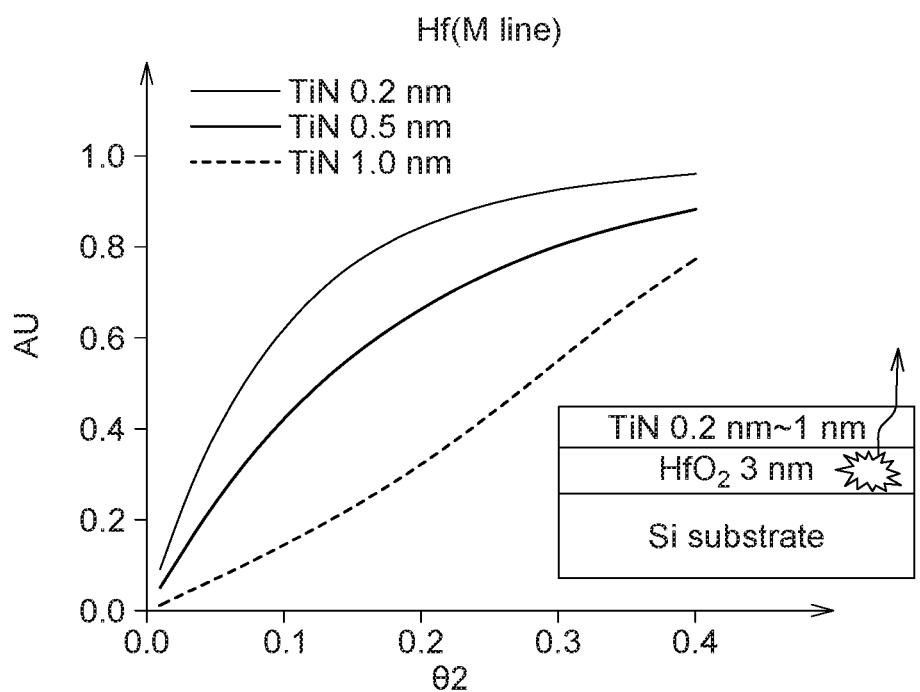
FIG. 9 shows the simulation curves, of the target ultrathin film consisting of TiN having the thickness of 0.2 nm, 0.5 nm, 1.0 nm on a substrate consisting of $HfO_2$/Si substrate, of the normalized intensity of the fluorescence (Hf M-line) versus the detection angles θ2.

FIG. 9 shows the simulation curves, of the target ultrathin film 100 consisting of TiN having the thickness of 0.2 nm, 0.5 nm, 1.0 nm on the substrate 300 consisting of a 3 nm HfO$_2$ layer and a Silicon substrate, of the normalized intensity of the fluorescence X-ray 330 (M line of Hf) versus the detection angles θ2. The results presented in this figure are dramatically different from that of FIG. 8; this difference highlights the impact of choosing different fluorescence spectrum as the probe.

Figure 10:
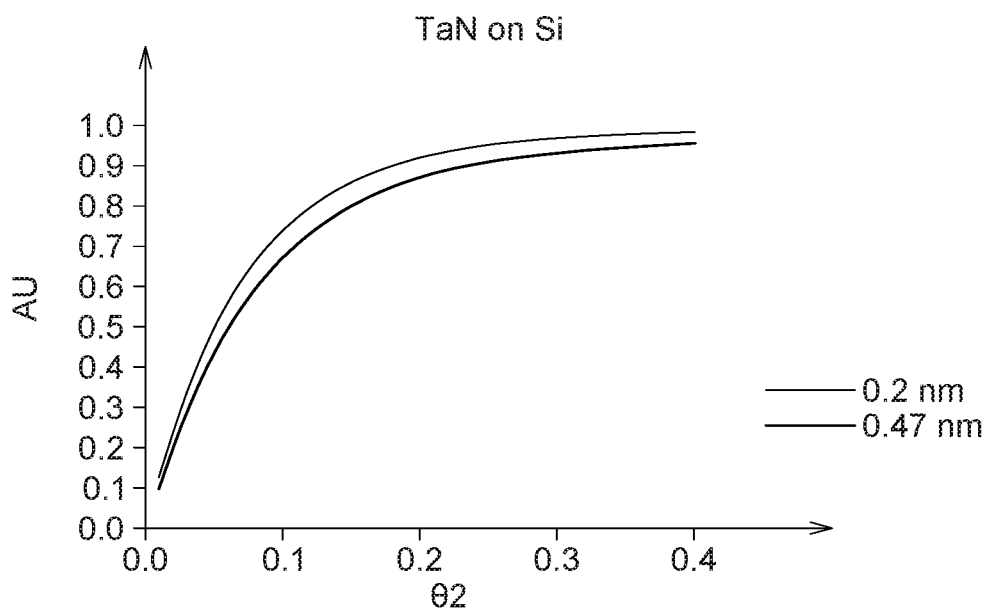
FIG. 10 shows the simulation curves, of the target ultrathin film consisting of TaN having the thickness of 0.2 nm, 0.47 nm on the substrate consisting of Si, of the normalized intensity of the Silicon K-line fluorescence versus the detection angles θ2.
Figure 11:
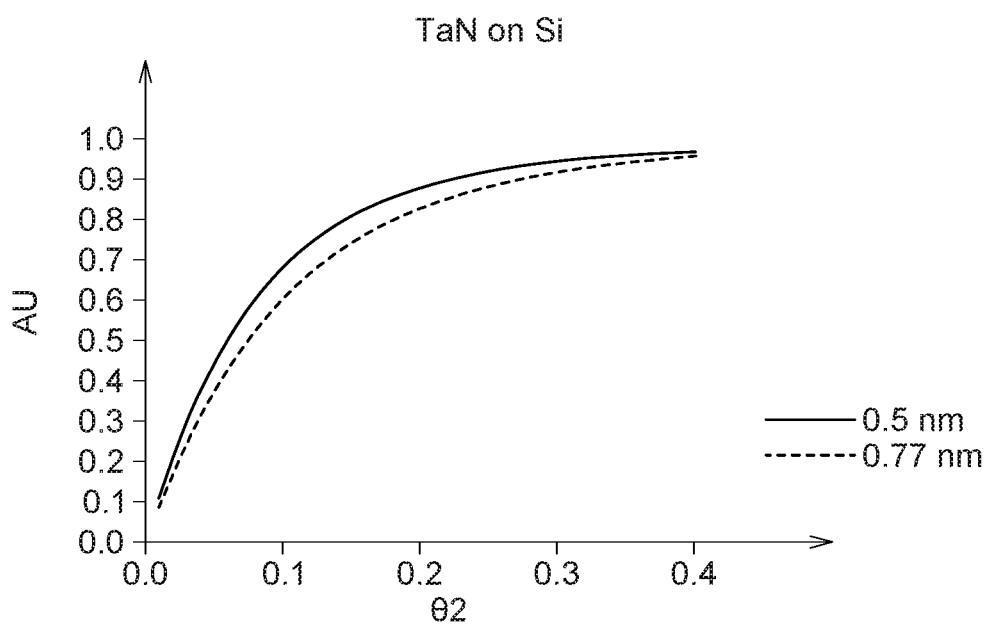
FIG. 11 shows the simulation curves, of the target ultrathin film consisting of TaN having the thickness of 0.5 nm, 0.77 nm on the substrate consisting of Si, of the normalized intensity of the Silicon K-line fluorescence versus the detection angles θ2.
Figure 12:
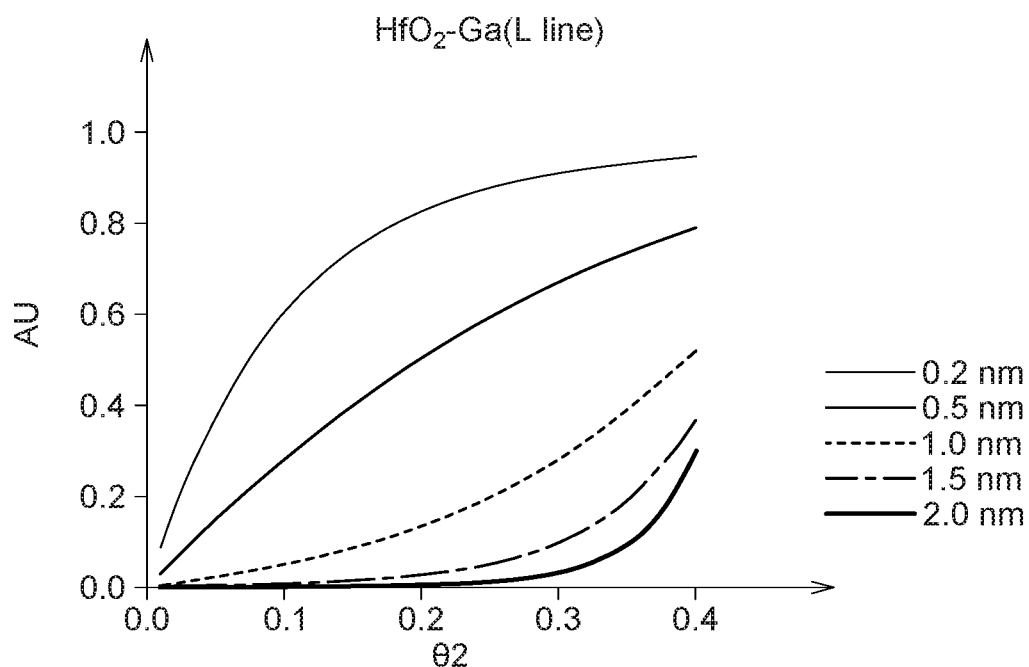
FIG. 12 shows the simulation curves, of the target ultrathin film consisting of $HfO_2$ having the thickness of 0.2 nm, 0.5 nm, 1.0 nm, 1.5 nm, 2.0 nm on the substrate consisting of GaAs, of the normalized intensity of the fluorescence (Ga L-line) of GaAs) versus the detection angles θ2.

FIG. 10 shows the simulation curves, of the target ultrathin film 100 consisting of TaN having the thickness of 0.2 nm, 0.47 nm on the substrate 300 consisting of Si, of the normalized intensity of the Silicon K-line fluorescence X-ray 330 versus the detection angles θ2. The optimal observation angle is 0.092 degrees where the sensitivity is 5.17%. FIG. 11 shows the simulation curves, of the target ultrathin film 100 consisting of TaN having the thickness of 0.5 nm, 0.77 nm on the substrate 300 consisting of Si, of the normalized intensity of the Silicon K-line fluorescence X-ray 330 versus the detection angles θ2. The optimal observation angle is 0.092 degrees where the sensitivity FIG. 12 shows the simulation curves, of the target ultrathin film 100 consisting of HfO$_2$ having the thickness of 0.2 nm, 0.5 nm, 1.0 nm, 1.5 nm, 2.0 nm on the substrate 300 consisting of GaAs, of the normalized intensity of the fluorescence X-ray 330 (Ga L-line of GaAs) versus the detection angles θ2.

Figure 13:
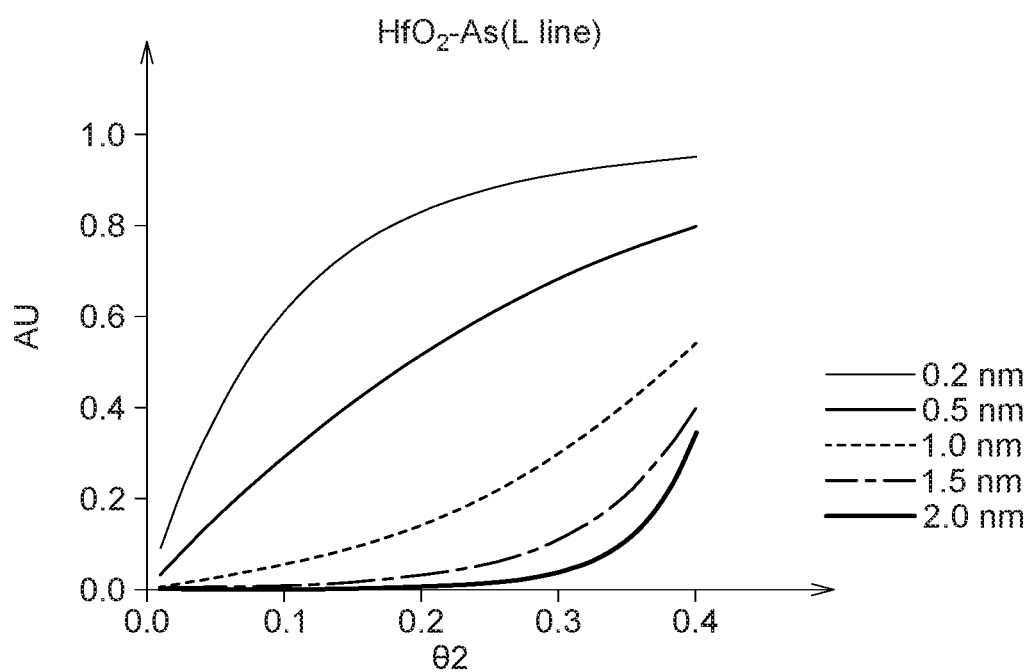
FIG. 13 shows the simulation curves, of the target ultrathin film consisting of $HfO_2$ having the thickness of 0.2 nm, 0.5 nm, 1.0 nm, 1.5 nm, 2.0 nm on the substrate consisting of GaAs, of the normalized intensity of the fluorescence (As L-line) of GaAs versus the detection angles θ2.

FIG. 13 shows the simulation curves, of the target ultrathin film 100 consisting of HfO$_2$ having the thickness of 0.2 nm, 0.5 nm, 1.0 nm, 1.5 nm, 2.0 nm on the substrate 300 consisting of GaAs, of the normalized intensity of the fluorescence X-ray 330 (As L-line of GaAs) versus the detection angles θ2. The results given in this figure and in the figures above illustrate that the fluorescence from both the elements in a compound substrate can be used as the probe for film thickness. Note that the fluorescence X-ray detector specified herein enables a simultaneous measurement of all the fluorescence X-rays of interests, i.e. a single θ2 scan suffices to collect data of both Ga L-line and As L-line as illustrated in FIG. 12 and FIG. 13. The above statement holds true also for the cases of multiple layers substrate such as what illustrated in FIG. 8 and FIG. 9 as well as other compound substrates such as InP.

Figure 14:
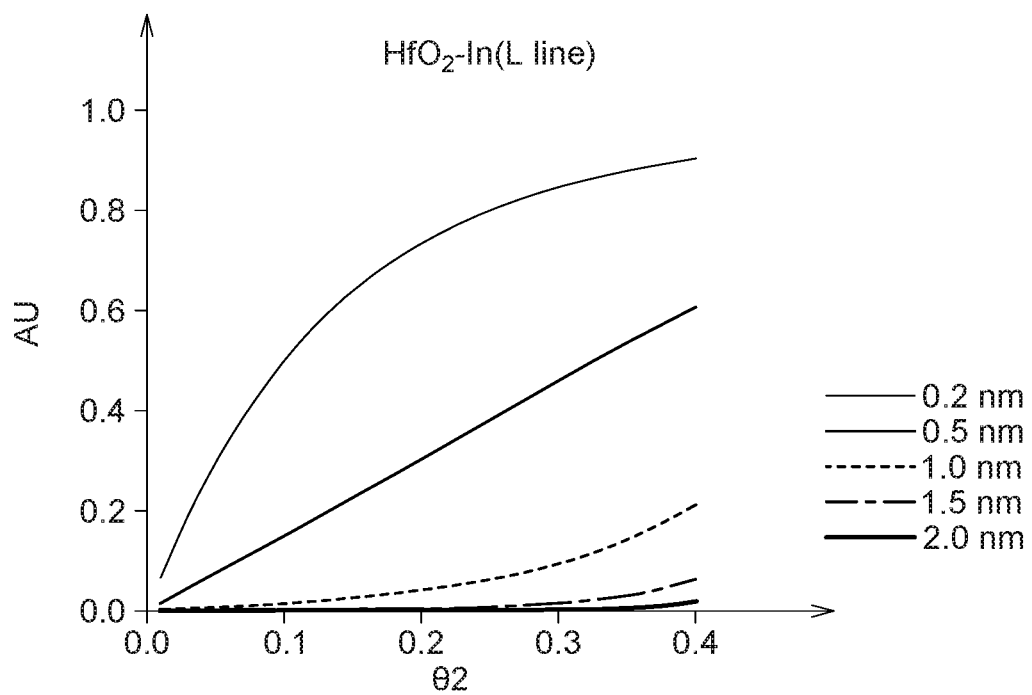
FIG. 14 shows the simulation curves, of the target ultrathin film consisting of $HfO_2$ having the thickness of 0.2 nm, 0.5 nm, 1.0 nm, 1.5 nm, 2.0 nm on the substrate consisting of InP, of the normalized intensity of the fluorescence (In L-line) of InP versus the detection angles θ2.

FIG. 14 shows the simulation curves, of the target ultrathin film 100 consisting of HfO$_2$ having the thickness of 0.2 nm, 0.5 nm, 1.0 nm, 1.5 nm, 2.0 nm on the substrate 300 consisting of InP, of the normalized intensity of the fluorescence X-ray 330 (In L-line of InP) versus the detection angles θ2.

Figure 15:
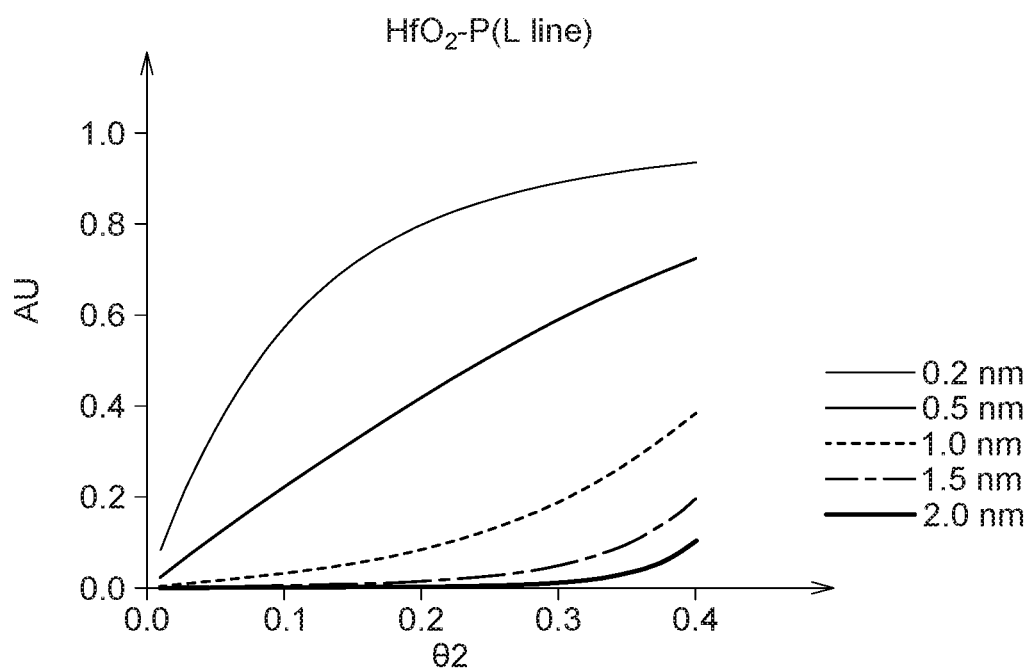
FIG. 15 shows the simulation curves, of the target ultrathin film consisting of $HfO_2$ having the thickness of 0.2 nm, 0.5 nm, 1.0 nm, 1.5 nm, 2.0 nm on the substrate consisting of InP, of the normalized intensity of the fluorescence (P K-line) of InP) versus the detection angles θ2.

FIG. 15 shows the simulation curves, of the target ultrathin film 100 consisting of HfO$_2$ having the thickness of 0.2 nm, 0.5 nm, 1.0 nm, 1.5 nm, 2.0 nm on the substrate 300 consisting of InP, of the normalized intensity of the fluorescence X-ray 330 (P K-line of InP) versus the detection angles θ2. The results given in this figure and in the figure above illustrate once again that the fluorescence from both the elements in a compound substrate can be used as the probe for film thickness.

Figure 16:
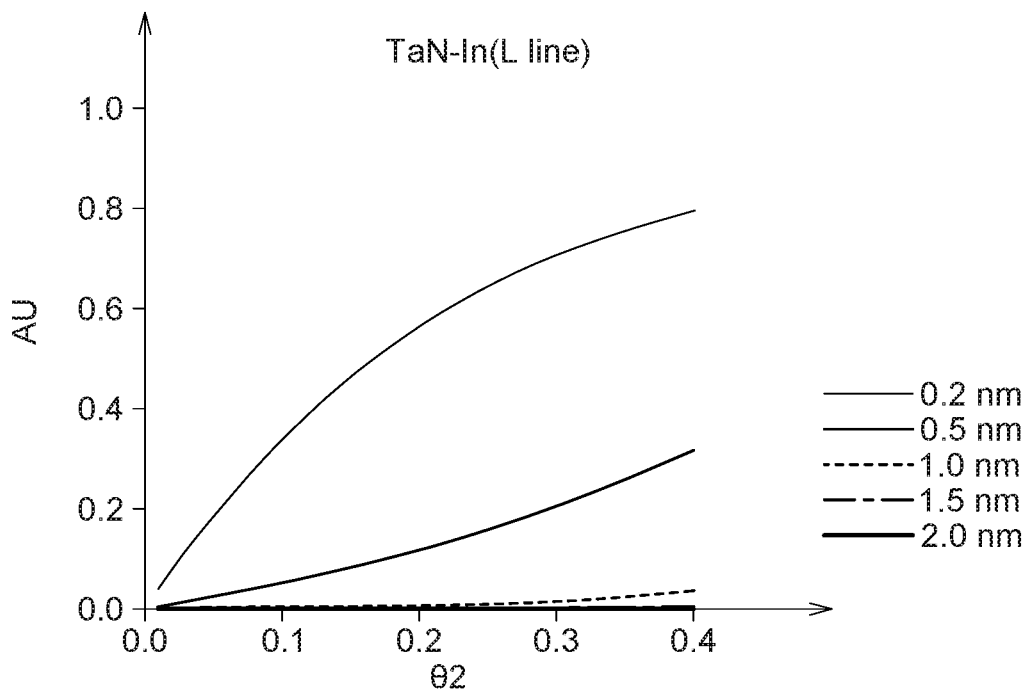
FIG. 16 shows the simulation curves, of the target ultrathin film consisting of TaN having the thickness of 0.2 nm, 0.5 nm, 1.0 nm, 1.5 nm, and 2.0 nm respectively on a InP substrate, of the normalized intensity of the In L-line fluorescence versus the detection angles θ2.

FIG. 16 shows the simulation curves, of the target ultrathin film 100 consisting of TaN having the thickness of 0.2 nm, 0.5 nm, 1.0 nm, 1.5 nm, 2.0 nm on the substrate 300 consisting of InP, of the normalized intensity of the fluorescence X-ray 330 (In L-line of InP) versus the detection angles θ2.

Figure 17:
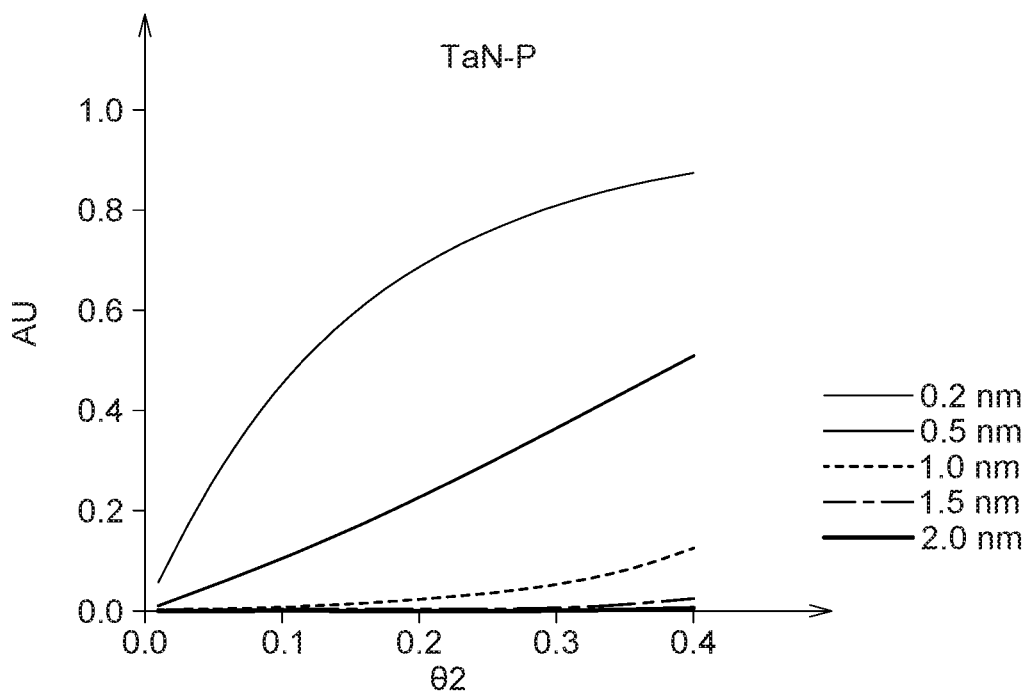
FIG. 17 shows the simulation curves, of the target ultrathin film consisting of TaN having the thickness of 0.2 nm, 0.5 nm, 1.0 nm, 1.5 nm, and 2.0 nm respectively on a InP substrate, of the normalized intensity of the P K-line fluorescence versus the detection angles θ2.

FIG. 17 shows the simulation curves, of the target ultrathin film 100 consisting of TaN having the thickness of 0.2 nm, 0.5 nm, 1.0 nm, 1.5 nm, 2.0 nm on the substrate 300 consisting of InP, of the normalized intensity of the fluorescence X-ray 330 (P K-line of InP) versus the detection angles θ2. The results given in this figure and in the figure above illustrate once again that the fluorescence from both the elements in a compound substrate can be used as the probe for film thickness. In comparison to the result given in FIG. 5, where Silicon is the substrate, the fluorescence from InP provides an improved SAXRL sensitivity.

The scattering length densities (SLD) of the different film materials (i.e. Si, TiN, HfO$_2$, TaN, Ti) of the test sample 200, and the characteristic fluorescence of the substrate materials are listed in table 1. The unit of the SLD is 1/Å$^2$ and the magnitude of SLD shows a weak dependence of the probing wavelength except for the TaN case.

TABLE 1

| | substrate | | | | |
|---|---|---|---|---|---|
| | Si substrate | GaAs substrate | GaAs substrate | InP substrate | InP substrate |
| fluorescence | Si K-line of 1739 eV/ 7.129 Å | Ga L-line of 1097.9 eV/ 11.2925 Å | As L-line of 1282 eV/ 9.67083 Å | In L-line of 3296.9 eV/ 3.7605 Å | P K-line of 2013 eV/ 6.15897 Å |
| Si | 1.53E−05 | 1.81E−05 | 1.77E−05 | 2.02E−05 | 1.71E−05 |
| TiN | 4.15E−05 | 4.13E−05 | 4.16E−05 | 4.01E−05 | 4.13E−05 |
| HfO$_2$ | 3.90E−05 | 4.65E−05 | 4.53E−05 | 6.46E−05 | 5.14E−05 |
| TaN | 1.97E−05 | 6.78E−05 | 6.68E−05 | 9.52E−05 | 7.03E−05 |
| Ti | 3.50E−05 | 3.46E−05 | 3.50E−05 | 3.36E−05 | 3.48E−05 |

It will be apparent to those skilled in the art that various modifications and variations could be made to the disclosed embodiments. It is intended that the specification and examples be considered as exemplary only, with a true scope of the disclosure being indicated by the following claims and their equivalents.

What is claimed is:

1. A device for measuring a thickness of a target film on a substrate, and the device comprising:
   a radiation source configured to project an excitation radiation toward an upper surface of the target film on the substrate with an incident angle θ1 with respect to the upper surface, wherein the incident angle θ1 is 45° to 90°, wherein the thickness of the target film is 2 nm or less; and
   a fluorescence X-ray detector configured to measure a fluorescence X-ray converted from the excitation radiation by the substrate with a grazing detection angle θ2 with respect to the upper surface, over a preset grazing angular range.

2. The device according to claim 1, wherein the thickness of the target film is 0.2 nm to 2 nm.

3. The device according to claim 1, wherein an energy of the excitation radiation is sufficiently high to excite the fluorescence X-ray from the substrate.

4. The device according to claim 1, wherein the excitation radiation comprises an X-ray beam or an electron beam.

5. The device according to claim 1, wherein the fluorescence X-ray detector is capable of scanning through a preset angular range with an angular step less than or equal to one hundredth of the preset angular range, an angular range is between 0° and 2°.

6. The device according to claim 1, further comprises a collimator configured to enable a detection of angular window or opening δθ2 at least a tenth of total angular range of the grazing detection angle θ2 or less.

7. The device according to claim 6, wherein a test sample comprises the target film and the substrate, the collimator is configured to control a detection of the fluorescence X-ray with the angular window or opening δθ2 at any given the grazing detection angle θ2.

8. The device according to claim 7, wherein the collimator is configured to be between the test sample and the fluorescence X-ray detector.

9. The device according to claim 1, wherein the target film has an X-ray scattering length density higher than an X-ray scattering length density of the substrate.

10. The device according to claim 9, wherein the substrate comprises multiple layers of different materials or a single material layer including a silicon wafer, a GaAs wafer, or an InP wafer, the fluorescence X-ray detector is configured to measure the fluorescence X-ray converted from the excitation radiation by one or more layers of the substrate, or by one or more elements of the substrate.

11. The device according to claim 1, wherein the fluorescence X-ray detector is capable of discerning energies and/or wavelengths of the fluorescence X-ray observed, thereby, to collect intensities of all of the fluorescence energies or wavelengths selected concurrently.

12. A method for measuring a thickness of a target film over a substrate, comprising:
   projecting an excitation radiation toward an upper surface of the target film with an incident angle θ1 with respect to the upper surface of the target film, wherein a range of the incident angle θ1 is between 45° to 90°;
   detecting a fluorescence X-ray converted from the excitation radiation by the substrate with a grazing detection angle θ2 defined with respect to the upper surface of the target film, wherein the grazing detection angle θ2 is 2°≥θ2≥0°; and
   calculating the thickness of the target film based on an angular dependence of measured fluorescence X-ray intensities after the measured fluorescence X-ray being normalized with a fluorescence X-ray intensity measured in the absence of the target film at the grazing detection angle θ2.

13. The method according to claim 12, wherein the excitation radiation comprises an X-ray beam or an electron beam with its energy sufficiently high to excite the fluorescence X-ray from one or more preselected element in layers of the substrate.

14. The method according to claim 12, comprising detecting fluorescence X-ray intensities with a plurality of the grazing detection angles θ2, wherein a fluorescence X-ray detector is capable of measuring a distribution of the fluorescence X-ray intensities as a function of a fluorescence wavelength or energy; thereby to concurrently measure the fluorescence X-ray intensities originated from one or more layers comprising the substrate or from one or more elements of a compound substrate comprising InP, or GaAs.

15. The method according to claim 12, wherein the thickness of the target film is 2 nm or less.

16. The method according to claim 12, wherein the thickness of the target film is 0.2 nm to 2 nm.

17. The method according to claim 12, further comprising a collimator to define an angular resolution δθ2 of the fluorescence X-ray measured and leaked through the target film, the value of the angular resolution δθ2 is set to be at least a tenth of total angular range of the grazing detection angle θ2 or less.

18. The method according to claim 12, further comprising a radiation source and a fluorescence X-ray detector, wherein the radiation source is configured to project the excitation radiation to generate the fluorescence X-ray from the substrate, the fluorescence X-ray detector is configured to receive the fluorescence X-ray leaked through the target film over a range of the grazing detection angle θ2.

19. The method according to claim 18, wherein a device comprises a collimator installed in front of the fluorescence X-ray detector, both the collimator and the fluorescence X-ray detector are capable of moving in unity over a present angular range of the grazing detection angle θ2 with an angular step size less than an angular resolution δθ2 defined by the collimator.

20. The method according to claim 12, wherein the substrate is either a single layer structure or a multi-layer structure.

* * * * *